United States Patent [19]

Roberts et al.

[11] Patent Number: 5,270,656

[45] Date of Patent: Dec. 14, 1993

[54] BIPLANAR RF COILS FOR MAGNETIC RESONANCE IMAGING OR SPECTROSCOPY

[75] Inventors: David A. Roberts, Drexel Hill; Erik K. Insko; John S. Leigh, Jr., both of Philadelphia, all of Pa.

[73] Assignee: The Trustees of the University of Pennsylvania, Philadelphia, Pa.

[21] Appl. No.: 873,418

[22] Filed: Apr. 24, 1992

[51] Int. Cl.[5] ............................................. G01R 33/20
[52] U.S. Cl. .................................. 324/318; 324/322; 335/282; 336/232; 336/181
[58] Field of Search ............... 324/322, 318, 314, 313; 335/299, 298, 296, 282; 336/232, 225, 200, 181

[56] References Cited

U.S. PATENT DOCUMENTS

| 2,999,977 | 9/1961 | Brown | 336/232 |
|---|---|---|---|
| 4,509,109 | 4/1985 | Hansen | 335/282 |
| 4,721,915 | 1/1988 | Kestler | 324/318 |
| 4,728,895 | 3/1988 | Briguet et al. | 324/318 |
| 4,793,356 | 12/1988 | Misic | 324/318 |
| 4,825,164 | 4/1989 | Requardt | 324/318 |
| 5,006,805 | 4/1991 | Ingwersen | 324/318 |
| 5,057,777 | 10/1991 | Kurczewski | 324/318 |
| 5,144,241 | 9/1992 | Oppelt | 324/318 |

FOREIGN PATENT DOCUMENTS

| 3628035 | 2/1988 | Fed. Rep. of Germany | 324/318 |
|---|---|---|---|
| 4024598 | 2/1991 | Fed. Rep. of Germany | 128/653.5 |

OTHER PUBLICATIONS

Bolinger et al., "A Multiple-Frequency Coil With a Highly Uniform $B_1$ Field," *Journal of Magnetic Resonance*, vol. 81, pp. 162–166 (1988).

Hayes et al., "An Efficient, Highly Homogeneous Radiofrequency Coil for Whole-Body NMR Imaging at 1.5 T," *Journal of Magnetic Resonance*, vol. 63, pp. 622–628 (1985).

Hoult et al., "The Signal-to-Noise Ratio of the Nuclear Magnetic Resonance Experiment," *Journal of Magnetic Resonance*, vol. 24, pp. 71–85 (1976).

Lorrain et al., "Magnetic Fields I," *Electromagnetic Fields and Waves*, Chapter 18, W. H. Freeman and Company, New York, pp. 326–343 (1988).

Schnall et al., "A Technique for Simultaneous $^1H$ and $^{31}P$ NMR at 2.2 T in Vivo," *Journal of Magnetic Resonance*, vol. 63, pp. 401–405 (1985).

Terman, *Radio Engineers' Handbook*, Chapter 2, McGraw-Hill Book Co., New York, pp. 48–49 (1943).

*Primary Examiner*—Michael J. Tokar
*Assistant Examiner*—Raymond Y. Mah
*Attorney, Agent, or Firm*—Woodcock Washburn Kurtz Mackiewicz & Norris

[57] ABSTRACT

A new geometry for a radio frequency coil design in which longitudinal conductors of the coil lie on two parallel planes. The currents in the conductors of one plane run in the opposite direction to those of the other plane. For the case of discrete conductors, field maps illustrate that the homogeneity and sensitivity of the biplanar design are superior to that of a saddle coil, and when the design is optimized, the homogeneity is almost as good as that for comparable discrete cosine or birdcage coil designs. The measured B1 map of an optimized, single-tuned biplanar coil in accordance with the invention thus compares favorably to that of an equivalent discrete cosine coil and demonstrates excellent homogeneity in the central region of the coil. However, the biplanar RF coils of the invention are advantageous in that the cost of the coils may be substantially reduced by reducing the number of conductors, in that the coil may be easily accessed on one of its sides as well as at both ends, and in that increased sensitivity is possible since the biplanar coils may be placed closer to the objects under investigation. This makes the coil of the present invention highly desirable for certain applications such as breast, shoulder, knee, wrist, neck and cardiac imaging.

12 Claims, 8 Drawing Sheets

BIPLANAR RF COILS FOR MAGNETIC RESONANCE IMAGING OR SPECTROSCOPY

BACKGROUND OF THE INVENTION

1. Field of the Invention

The present invention relates to a radio frequency coil for magnetic resonance imaging or spectroscopy, and more particularly, to a radio frequency volume coil design having a biplanar geometry in which two sets of conductors, each carrying currents in opposite directions, lie on the surfaces of two parallel planes.

2. Description of the Prior Art

In magnetic resonance imaging (MRI) and spectroscopy, it is desired to develop a highly uniform excitation profile (magnetic field) across the object under investigation. Many recent designs for radio frequency (RF) coils have been based on the paradigm that a cylindrical sheet of current density will produce a perfectly uniform transverse component of magnetic field so long as the current density, J, is distributed according to the cosine of the azimuthal angle, $\theta$, in accordance with the following equation:

$$J(\theta) = \left(\frac{2rB_1}{\mu_0}\right)\cos(\theta)k, \qquad \text{Equation 1}$$

where $\mu_0$ is the permeability of free space, r is the radius of the coil, $B_1$ is the measured magnetic field, and k is a unit vector parallel to the axis of the cylinder. Hence, the so-called "birdcage" coil developed by Hayes et al. and described in an article entitled "An Efficient, Highly Homogeneous Radiofrequency Coil for Whole-Body NMR Imaging at 1.5 T," *Journal of Magnetic Resonance*, Vol. 63, p.622 (1985) has been widely used. A birdcage coil approximates the current distribution of Equation (1) by placing a number of wires at equal spacing around a cylinder. The desired resonant mode of the birdcage coil is thus one in which a $\cos(\theta)$ current distribution exists in the wires of the coil. A birdcage design is advantageous in that it offers the advantage of being usable in a quadrature mode, which decreases the power requirements by a factor of 2 and increases the sensitivity by a factor of $\sqrt{2}$. In an alternative design, proposed by Bolinger et al. in an article entitled "A Multiple-Frequency Coil With a Highly Uniform $B_1$ Field," *Journal of Magnetic Resonance*, Vol. 81, p.162 (1988), a number of wires, each carrying the same current, is placed around a cylinder to form a discrete cosine coil in which the spacing between the wires is proportional to $\cos(\theta)$.

Although cylindrical coils have been shown to provide homogeneous magnetic fields, cylindrical coils typically require many wires and are thus relatively difficult to build and, as a result, are quite expensive. In addition, as described by Schnall et al. in an article entitled "A Technique for Simultaneous $^1H$ and $^{31}P$ NMR at 2.2 T *in Vivo*," *Journal of Magnetic Resonance*, Vol. 63, pp.401–405 (1985), coil designs such as the birdcage design are quite difficult to tune to multiple frequencies. Moreover, sensitivity of such coils is limited because of the difficulty of placing cylindrical coils in close proximity of the object being investigated. Furthermore, and quite importantly, it is often quite difficult to optimally place a patient within a cylindrical coil since the coil is only open at its ends. In other words, for imaging a patient's torso and the like, the diameter of the coil must be increased to accommodate the patient's shoulders, which leads to reduced sensitivity of the coil. Also, since the patient must slide into an end of the cylindrical coil for upper body measurement, the patient must be completely surrounded by the cylindrical coil, which can cause acute claustrophobia.

Accordingly, it is desired to develop an alternative coil design which increases the sensitivity of the measurements in order to increase the achievable resolution of the resulting images while also providing for easy access for upper body imaging of a patient, for example, at a reduced cost. In particular, the present inventors feel that given the extremely high field homogeneity of coil designs presently in use, such as the birdcage coil, that there is room for a further tradeoff of homogeneity for sensitivity. The biplanar RF coils of the invention have been designed to meet these needs.

SUMMARY OF THE INVENTION

The biplanar RF coils of the invention provide the above-mentioned benefits by providing a novel geometry for radio frequency volume coil design which provides easy access by the patient yet may be placed much closer to the sample so as to increase sensitivity while still providing substantially homogeneous fields which are sufficient for the vast majority of imaging purposes.

In particular, the present inventors have implemented a biplanar geometry for RF volume coil design in which two sets of conductors, each carrying currents in opposite directions, lie on the surfaces of two parallel planes. The inventors have also derived an analytical expression for the magnetic field produced by continuous surface currents in this geometry. Namely, numerical integration of the Biot-Savart law for discrete wire indicates that the homogeneity and sensitivity of this design are comparable to those obtained for an equivalent discrete cosine coil geometry. For example, the present inventors have found that a 6-strut biplanar coil has a magnetic field map which compares favorably to that of a 12-strut birdcage coil of similar dimensions. However, the biplanar design of the invention is much easier to construct and may be tuned to multiple frequencies by using tank circuits. Moreover, the arrangement of the conductors of the biplanar coil of the invention allows for completely free access to one side of the coil as well as both ends, which may be highly desirable for certain imaging applications.

A preferred embodiment of a biplanar radio-frequency coil in accordance with the invention comprises a first planar resonating element comprising a first set of substantially parallel conductors extending in a longitudinal direction of the first planar resonating element; a second planar resonating element, disposed substantially parallel to the first planar resonating element, comprising a second set of substantially parallel conductors extending in a longitudinal direction of the second planar resonating element, whereby the second set of conductors are substantially parallel to the first set of conductors; and means for applying a current which propagates in a first direction through each conductor of the first set of conductors and a current which propagates in a second direction, substantially opposite to the first direction, through each conductor of the second set of conductors so as to form a substantially homogeneous magnetic field in a region between the first and second planar resonating elements. Preferably, the biplanar radio-frequency coils of the invention are used for magnetic resonance imaging and spectroscopy, although the coils of the invention may be used for other purposes such as in the magnetic deflection circuitry of cathode ray tubes.

In preferred embodiments, the first and second planar resonating elements have a width in a direction transverse to the longitudinal direction which is approximately 1.2 times the distance between the first and second planar resonating elements. The region of the homogeneous magnetic field is generally a volume centered between the first and second planar resonating elements. The volume typically has a side length which is one-half the distance between the first and second planar resonating elements. Means also may be provided for adjusting the separation distance between the first and second planar resonating elements.

Preferably, each of the conductors of the first and second sets of conductors comprises a strip of copper tape, and in an optimized configuration, the first and second sets of conductors each comprise four substantially parallel strips of copper tape.

The coil of the invention also may comprise means for double tuning the biplanar coil to at least two resonant frequencies. In an exemplary embodiment, the resonant frequencies are the resonant frequencies for $^1$H and $^{31}$P, although other resonant frequencies may be readily measured in accordance with the techniques of the invention.

In an alternative embodiment, a quadrature coil based upon a biplanar geometry is provided which combines the advantages of a birdcage design which may be used in a quadrature mode with the benefits of a biplanar design. This coil comprises a second biplanar coil disposed perpendicular to the first biplanar coil so as to form an enclosed volume open at both ends. When a suitable coupling is provided, circularly polarized magnetic fields are produced in the enclosed volume between the respective biplanar coils.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which.

DETAILED DESCRIPTION OF THE PRESENTLY PREFERRED EXEMPLARY EMBODIMENT

The inventors of the subject matter disclosed and claimed herein have met the above-mentioned needs in the art by developing a biplanar RF coil design for use in magnetic resonance imaging or spectroscopy which has good sensitivity and homogeneity in the imaging region. Although the invention will be described herein with respect to particular embodiments, it will be appreciated by those of ordinary skill in the art that the description given herein is for exemplary purposes only and is not intended in any way to limit the scope of the invention. Accordingly, all questions regarding the scope of the invention may be resolved by referring to the appended claims.

Figure 1:
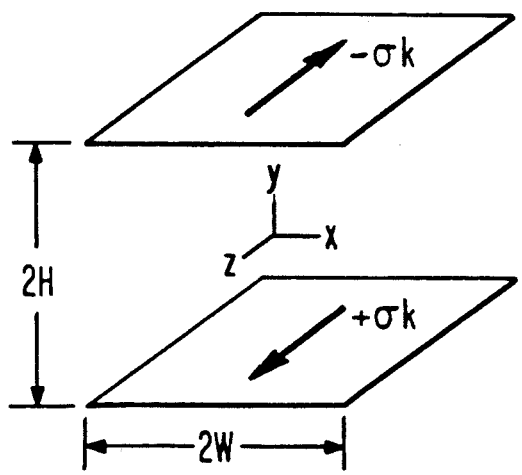
FIG. 1 illustrates the geometry of surface currents in a continuous biplanar geometry in accordance with the invention.

In designing the RF coil of the present invention, the present inventors chose to develop a coil design which is based upon a fundamentally different paradigm than the cylindrical RF coils of the prior art. In particular, the present inventors have recognized that if two parallel, infinite planes carry current densities $\sigma k$ and $-\sigma k$ (where k is a unit vector in the z-direction in the magnetization plane), respectively, then the magnetic field in the region between the planes is of uniform magnitude and direction. This may be easily calculated from Ampere's law:

$$B(r) = \mu_0 \sigma i \qquad \text{Equation 2}$$

were i is a unit vector in the x-direction. For the case of two infinitely long parallel conductive sheets of width 2W (along the x-axis) separated by a distance 2H (along the y-axis) which carry currents in opposite directions as shown in FIG. 1, the magnetic field at a point r due to a surface current distribution, $\sigma$, is given by the Biot-Savart law as:

$$B(r) = \frac{\mu_0}{4\pi} \int \frac{\sigma(r') \times (r - r')}{|r - r'|^3} dr', \qquad \text{Equation 3}$$

where the integration is over the surface. Straightforward evaluation of Equation 3 (where it is assumed that the planes are infinitely long) for opposite surface currents on the two planes yields the following analytical solutions for the magnetic field:

$$B_x(x,y,z) = \frac{\mu_0 I}{\pi W} [\theta_1 + \theta_2 + \theta_3 + \theta_4], \qquad \text{Equation 4a}$$

$$B_y(x,y,z) = \frac{\mu_0 I}{\pi W} \left[ \ln\left( \frac{\cos\theta_1 \cos\theta_4}{\cos\theta_2 \cos\theta_3} \right) \right], \qquad \text{Equation 4b}$$

$$B_z(x,y,z) = 0 \qquad \text{Equation 4c}$$

where:

$$\theta_1 = \arctan\left[\frac{W+x}{H+y}\right] \quad \text{Equation 5a}$$

$$\theta_2 = \arctan\left[\frac{W-x}{H+y}\right] \quad \text{Equation 5b}$$

$$\theta_3 = \arctan\left[\frac{W+x}{H-y}\right] \quad \text{Equation 5c}$$

$$\theta_4 = \arctan\left[\frac{W-x}{H-y}\right] \quad \text{Equation 5d}$$

Figure 2:
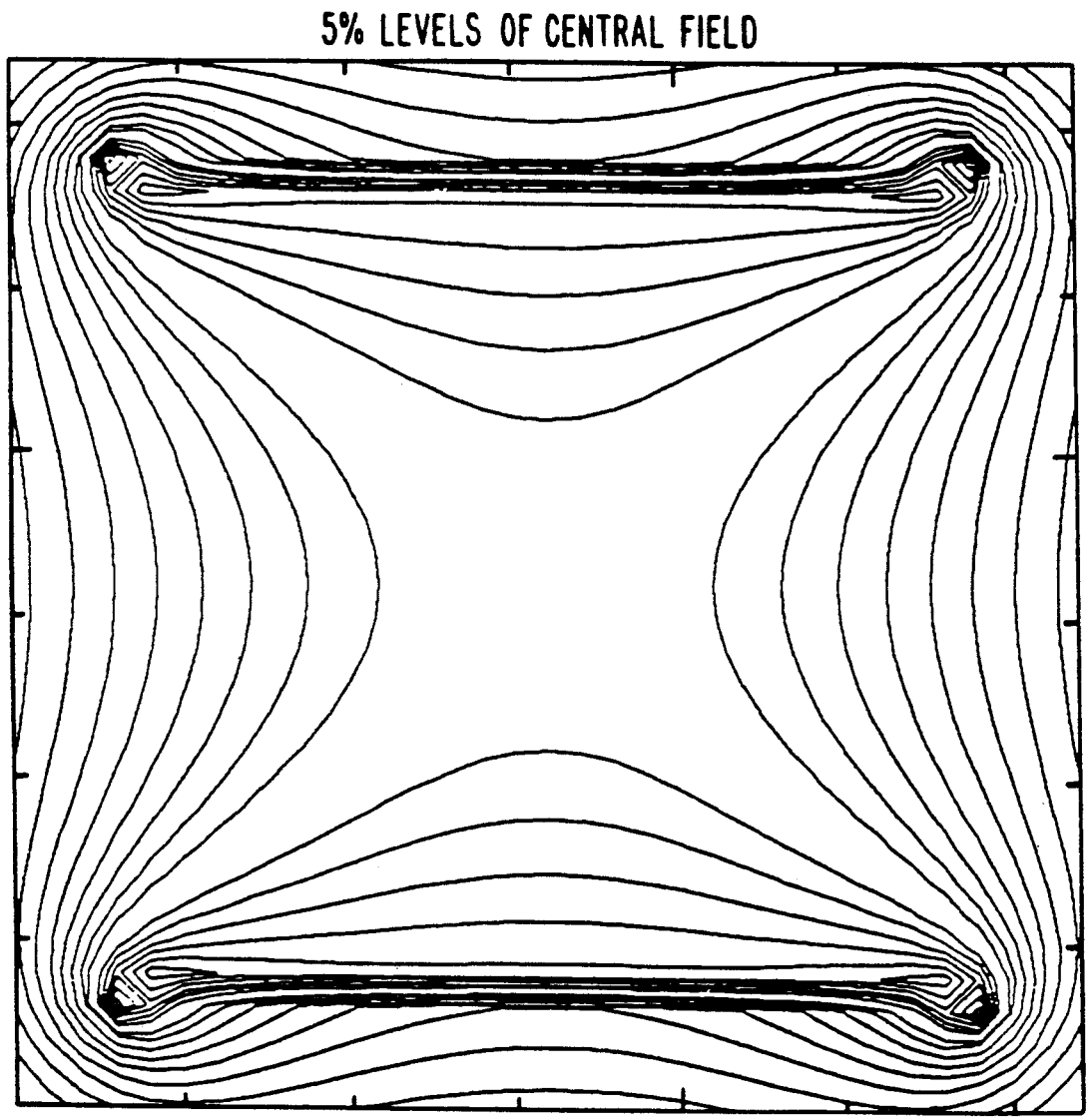
FIG. 2 illustrates a calculated contour plot of the magnitude of the transverse magnetic field produced by surface currents running in a continuous biplanar geometry in accordance with the invention. The contours represent 5% levels above and below the value of the magnetic field at the origin.

A contour plot of the magnitude of the B1 field given by Equations 4a through 4c on the plane corresponding to z=0 is shown in FIG. 2, where W=5 cm and H=5 cm. The contours represent 5% levels above and below the value of the magnetic field at the origin. The plot illustrated in FIG. 2 demonstrates the excellent homogeneity of the magnetic field in the central region between the planes.

The present inventors performed computer simulations to calculate the magnetic field produced by the currents running in a finite set of wires in the discrete biplanar geometry. The magnetic field was calculated by considering each coil to be composed of a finite number of straight wire segments of finite length using the analytical solution provided by way of example by Lorrain et al. in an article entitled "Magnetic Fields I," *Electromagnetic Fields and Waves*, Chapter 18, W. H. Freeman and Company, New York, pp.326–343 (1988). The total field was computed as the vector sum of the fields produced by each wire segment in the coil, where the effects due to the end rings of the coils were ignored. The magnetic field at a point, r, due to a current, I, running from point $r_1$ to point $r_2$ was found to be given by:

$$B = \frac{\mu_0 I (r_1 - r) \times (r_2 - r_1)}{2\pi d |(r_1 - r) \times (r_2 - r_1)|}, \quad \text{Equation 6}$$

where $\mu_0$ is a permeability of free space and d is the distance from point r to the wire.

The effect of mutual inductance was also included in all simulations. The total mutual inductance along each current path, $M_{21}$, was estimated using a solution of the Neumann equation:

$$M_{21} = \frac{\mu_0}{4\pi} \oint \oint \frac{dL_2 \, dL_1}{|r_2 - r_1|} \quad \text{Equation 7}$$

The total self inductance along each current path was estimated using formulas from Terman in *Radio Engineers' Handbook*, Chapter 2, McGraw-Hill Book Co., New York, pp. 48–49 (1943).

For purposes of simulation, the sensitive region of the coil of the invention was defined to be a volume, centered at the origin, whose side-length is one-half the plane separation distance. The coils were always considered to be centered on the origin, and the total current in the coils was always normalized to one ampere, after taking into account the effects of mutual inductance. The inhomogeneity, I, is thus defined as the root-mean-square (rms) variance of the magnitude of the field over the sensitive region, normalized by the magnitude of the field at the origin (0,0,0). The reciprocity theorem described by Hoult et al. in an article entitled "The Signal-to-Noise Ratio of the Nuclear Magnetic Resonance Experiment," *Journal of Magnetic Resonance*, Vol. 24, p.71 (1976) states that the voltage induced in a coil by a processing magnetic moment at a point, r, is proportional to the magnitude of the magnetic field produced at r when a unit current flows through the coil. For this reason, the magnitude of the field at the origin, $B_0 = B(0,0,0)$, is used as a measure of coil sensitivity. Since it is desired to maximize the sensitivity while at the same time minimizing the inhomogeneity, the ratio of the central field to the inhomogeneity, $P = B_0/I$, is used as a measure of coil performance, where the units of this measure are Gauss.

Figure 3:
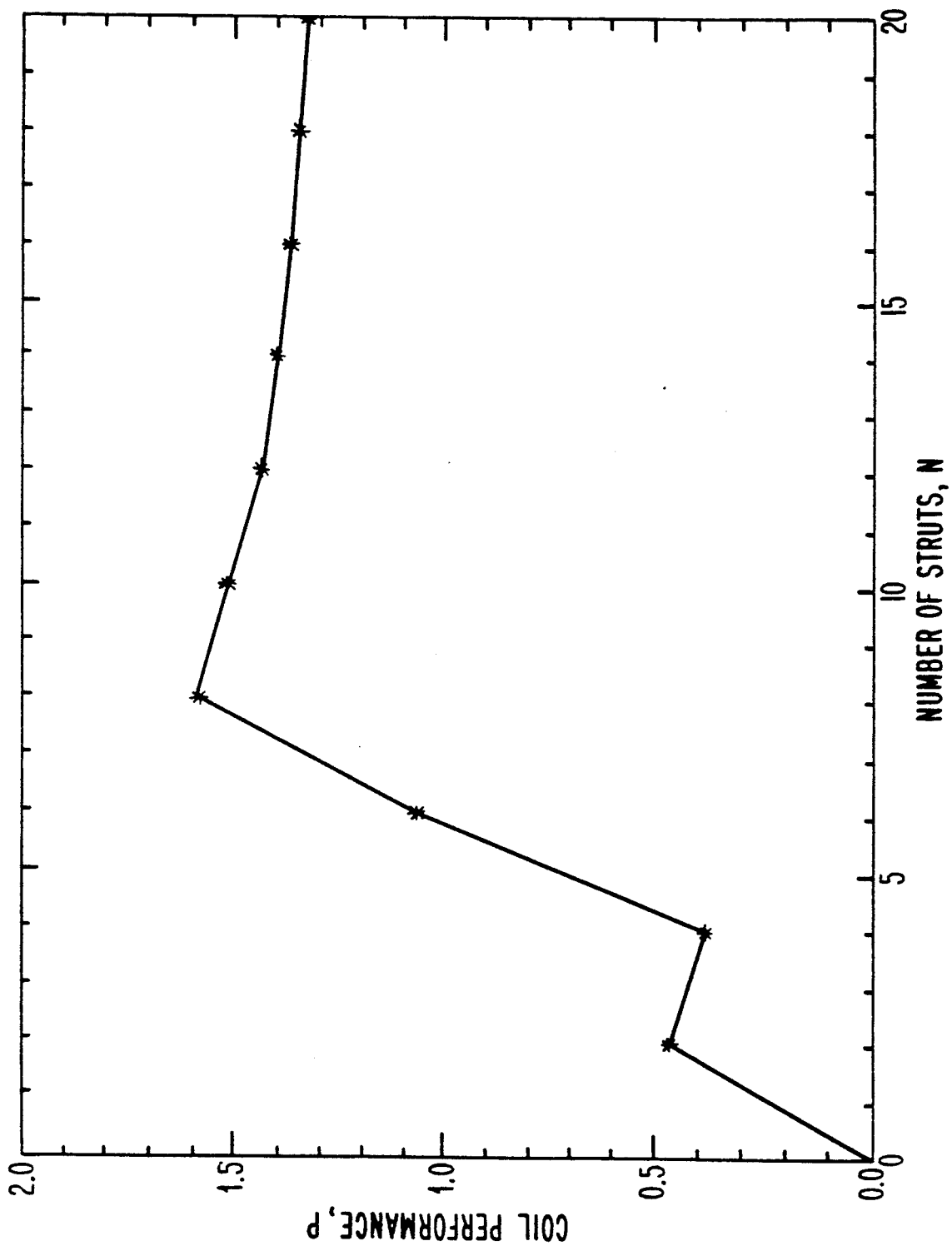
FIG. 3 illustrates the coil performance P of a biplanar RF coil in accordance with the invention versus the number of discrete wires N used in the biplanar coil.

Optimizations of the coil of the invention were performed by varying a single parameter and then determining the performance, P, of the coil. As illustrated in FIG. 3, the coil performance P is plotted as a function of the number, N, of equally spaced discrete wires of a square biplanar coil of width 5 cm and length 20 cm. As illustrated, the optimal coil performance was achieved for N=8 conductors, four in each plane of the coil. Hence, a presently preferred embodiment of the invention comprises a coil having 2 planes, with 4 substantially parallel conductors in each plane as illustrated in FIG. 4.

Figure 4:
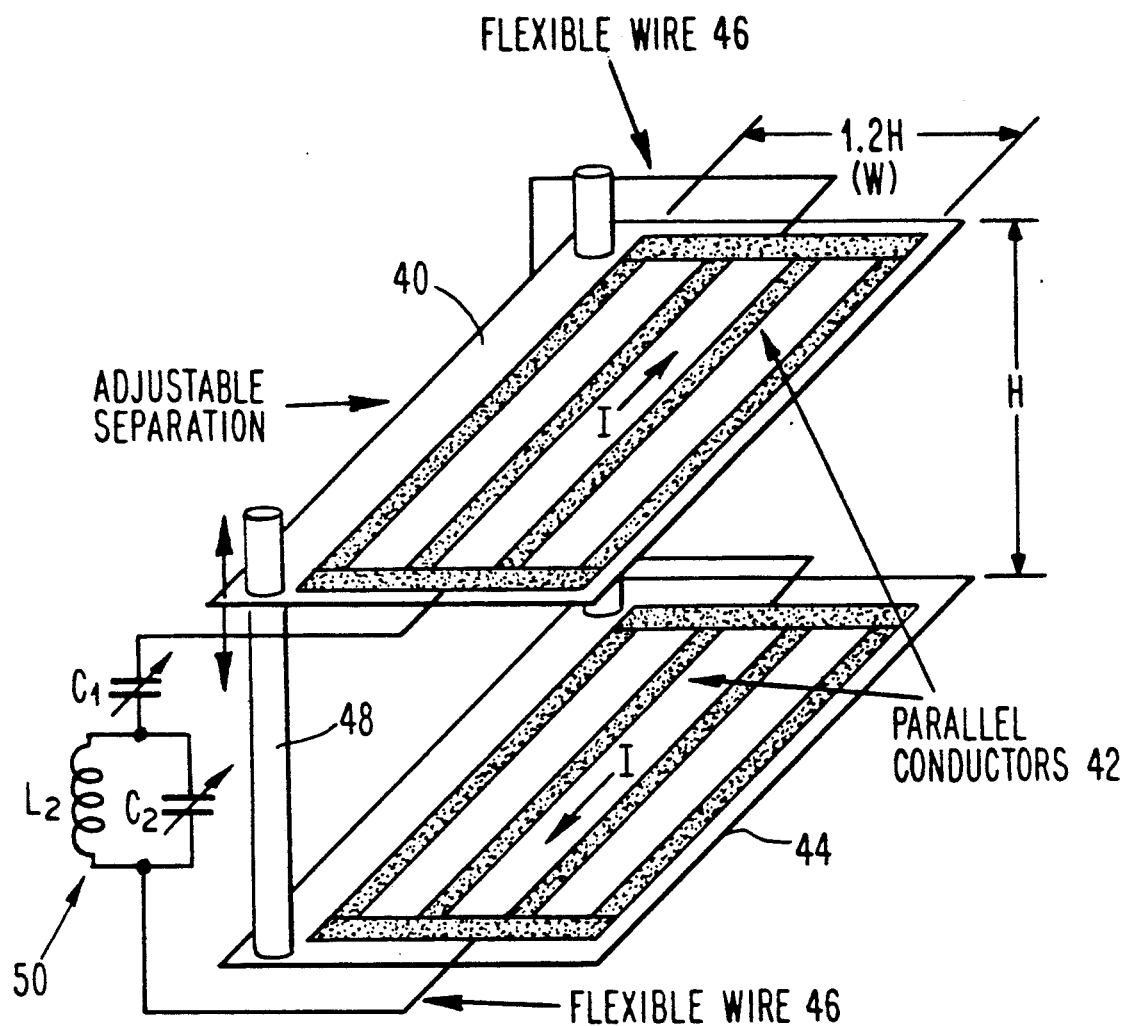
FIG. 4 illustrates a preferred embodiment of a biplanar radio frequency coil in accordance with the invention.

As illustrated in FIG. 4, a preferred embodiment of the biplanar RF coil of the invention comprises a first plane 40 having four parallel conductors 42 and a second plane 44 having four parallel conductors 42. Flexible wires 46 apply currents, I, to the respective planes, where the current in each plane travels in opposite directions as indicated. Planes 40 and 44 are preferably maintained parallel to each other using adjustable separation means 48, which allows the planes 40 and 44 to be moved with respect to each other so as to come into closer proximity with the object under investigation. By adjusting the planes 40 and 44 to be as close as possible to the object being investigated, sensitivity can be significantly improved. Of course, any other suitable adjustment means may be provided, as would be apparent to one skilled in the art. Wires 46 are preferably flexible to accommodate this adjustment. As is apparent from FIG. 4, the geometrical arrangement of the coil of the invention is significant in that at last three sides are open so as to allow easy access to the most sensitive region of the coil.

In a preferred embodiment of the invention, the coil of the invention further comprises at least one trap circuit 50 for providing multiple tuning of the coil. Generally, capacitor $C_2$ and inductor $L_2$ form trap circuit 50 and are tuned to the higher of the two desired resonant frequencies, while capacitor $C_1$ and the coil's inductance generate the lower of the two desired resonant frequencies.

Those skilled in the art will appreciate that the configuration of FIG. 4 is sufficient for relatively small coils. However, when building larger biplanar coils, which may accommodate the human torso, for example, an identical, symmetrical trap circuit 50 and tuning capacitance should be added to the other end of the coil of FIG. 4 to eliminate standing wave phenomena, which become of increasing significance as the lengths of the current paths approach the wavelength of the operating frequency. Both trap circuits 50 could then be tuned in the same manner to the same frequencies.

Figure 5A:
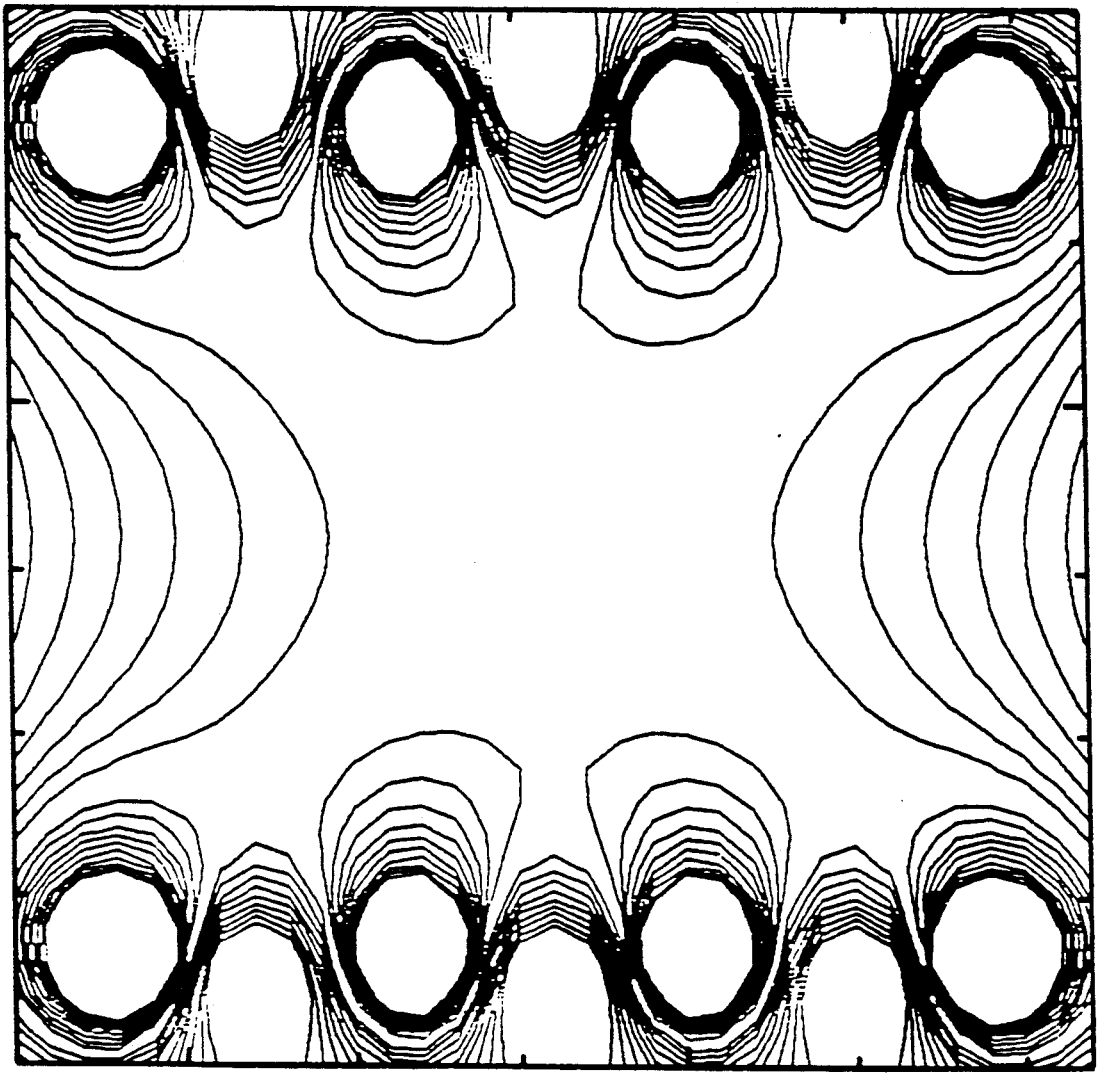
FIGS. 5(A)–5(C) respectively illustrate calculated contour plots of the magnitude of the transverse magnetic field produced by an 8-strut biplanar coil (FIG. 5(A)), a 10-strut birdcage coil (FIG. 5(B)), and an 8-strut discrete cosine coil (FIG. 5(C)) of comparable size. The contours again represent 5% levels above and below the value of the magnetic field at the origin.
Figure 5B:
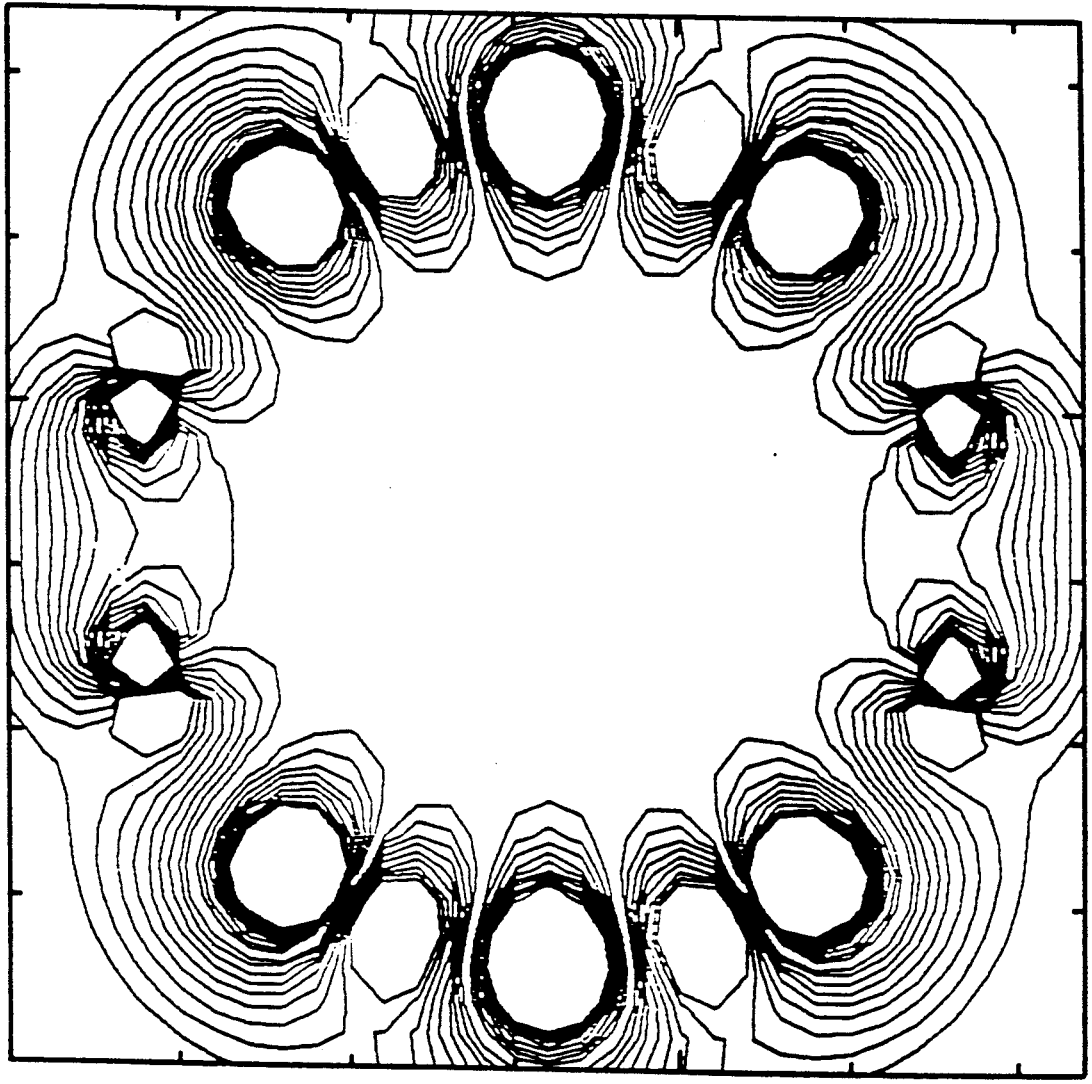
Figure 5C:
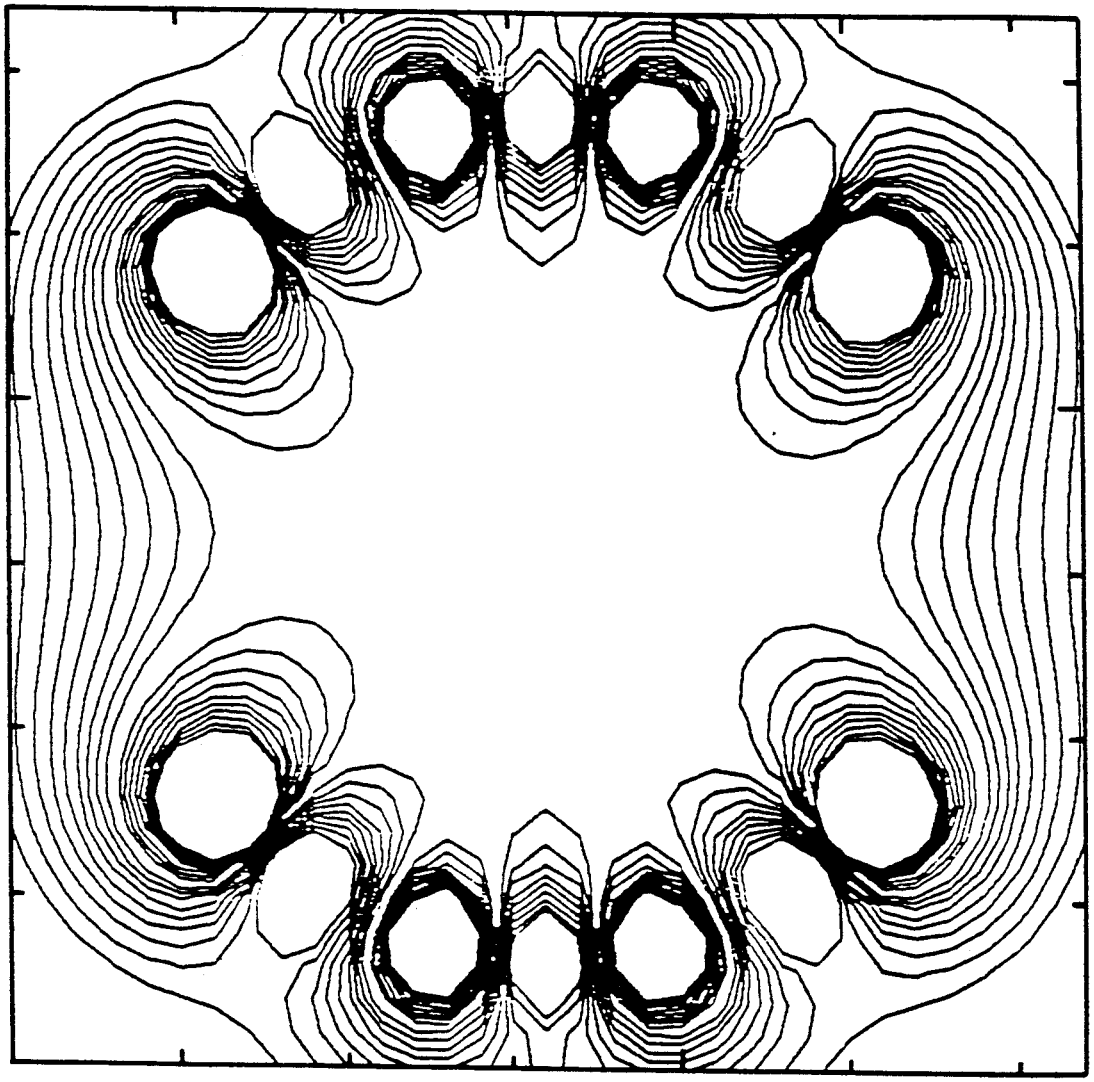

A contour plot of the magnitude of the magnetic field produced by the 8-strut biplanar coil of FIG. 4 appears in FIG. 5(a). As shown, a large region of the sensitive volume of the coil lies within the ±5% contour levels. For purposes of comparison, field plots of a 10-strut birdcage coil and an 8-strut discrete cosine coil of similar dimensions appear in FIGS. 5(b) and 5(c), respectively. Table 1 below further lists the values obtained through simulation for the inhomogeneity (I), sensitivity (S), and coil performance (P) for four different coil designs. The simulations clearly predict that the performance of an 8-strut biplanar coil is superior to that of a saddle coil but slightly below that of a discrete cosine or birdcage design.

TABLE 1

Calculated Performance Characteristics For Four Different Coil Designs, Where Each coil was 20 cm long.

| COIL TYPE | S (gauss) | I | P (gauss) |
|---|---|---|---|
| 1) Saddle coil (N = 4); radius = 5 cm | 0.056 | 0.044 | 1.3 |
| 2) Biplanar coil (N = 8); Separation = 10 cm | 0.048 | 0.027 | 1.8 |
| 3) Discrete Cosine coil (N = 8); radius = 5 cm | 0.058 | 0.023 | 2.5 |
| 4) Birdcage coil (N = 10); radius = 5 cm | 0.055 | 0.014 | 3.9 |

Figure 6:
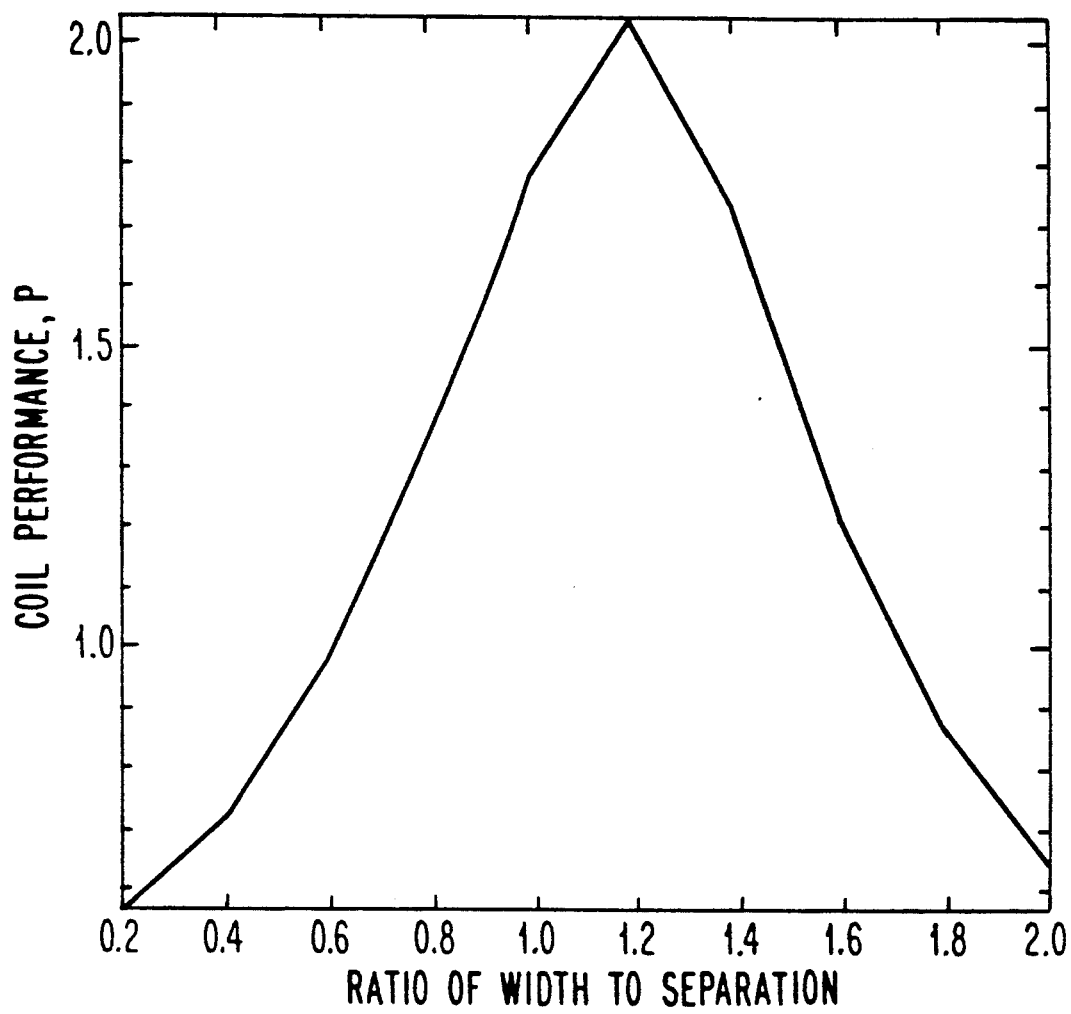
FIG. 6 illustrates the performance P of the biplanar coil of the invention versus the ratio of the width to separation of an 8-strut biplanar coil designed in accordance with the invention.

However, further computer simulations were performed to determine the optimal configuration for the biplanar design. FIG. 6 illustrates the resultant effect on coil performance P of increasing the spacing between conductors at a constant plane separation of 10 cm for an 8-strut coil. As illustrated, the optimal performance was found to occur when the ratio of the coil width (W) to separation distance (H) of the planes of the coil is approximately 1.2 (see FIG. 4). This value was also found to be approximately 0.8 for a 6-strut biplanar coil.

EXAMPLES

A. An optimized, 8-strut, single-tuned $^1H$ biplanar coil was inductively coupled to a 1.8T NMR imaging system having an operating frequency for $^1H$ of 78.2 MHz. The coil was 20 cm long and 12 cm wide with a plane separation of 10 cm. In addition, a 22-strut discrete cosine coil of similar dimensions was evaluated for purposes of comparison. Each coil was constructed from 3 mm diameter copper tubing, and the unloaded Q of the biplanar coil was approximately 150. The Q dropped to approximately 80 when loaded with a saline phantom which filled its interior.

A magnetic field map of the coil was obtained by generating a $(\theta, 2\theta)$ pair of spin-echo images of a slice phantom of width 1 cm. The magnetic field map of the biplanar coil was made along a plane corresponding to z=0 in the center of the coil and was found to demonstrate excellent homogeneity over the sensitive region of the coil.

Images of simple saline phantoms were then generated using the biplanar and discrete cosine coils described above, where the phantoms completely filled the interiors of the coils. A spin-echo pulse sequence with TE=25 msec and TR=1 sec was used, and four signal averages were acquired, yielding an imaging time of approximately 8 minutes. Values for the signal to noise ratio (SNR) and normalized rms variance over a 3×3 cm region of interest in the center of the coils appear in Table 2 below. As illustrated, SNR and homogeneity of the 8-strut biplanar coil was found to be slightly less than that of the 22-strut discrete cosine coil, but as will be apparent to one of ordinary skill in the art, the biplanar coil of the invention could be made at substantially less cost with comparable results.

TABLE 2

Values For Signal-to-Noise (SNR) and Normalized RMS Variance (STD %) For Images Generated Using Two Different Coils of Similar Dimensions

| Coil Type | SNR | STD (%) |
|---|---|---|
| 1) 8-strut Biplanar | 27.5 | 3.6 |
| 2) 22-strut Discrete Cosine | 30.7 | 3.0 |

B. In order to evaluate the clinical performance of such coils, a 6-strut 30×24×40 cm, inductively-driven, double-tuned $^1H/^{31}P$ biplanar coil was interfaced to a 1.5T General Electric Signa imaging system. The coil was constructed from half-inch wide copper tape and high-resolution images of a normal volunteer in the axial and sagittal planes were taken. A multislice imaging sequence with TE=30 msec and TR=3000 msec was used. The slice thickness was 5 mm, and the field of view was 30 cm for the axial image and 45 cm for the sagittal image. Although the patient was lying directly on one of the planes of the coil, the images illustrated excellent homogeneity across nearly all of the imaging volume in both the axial and sagittal planes.

Figure 7:
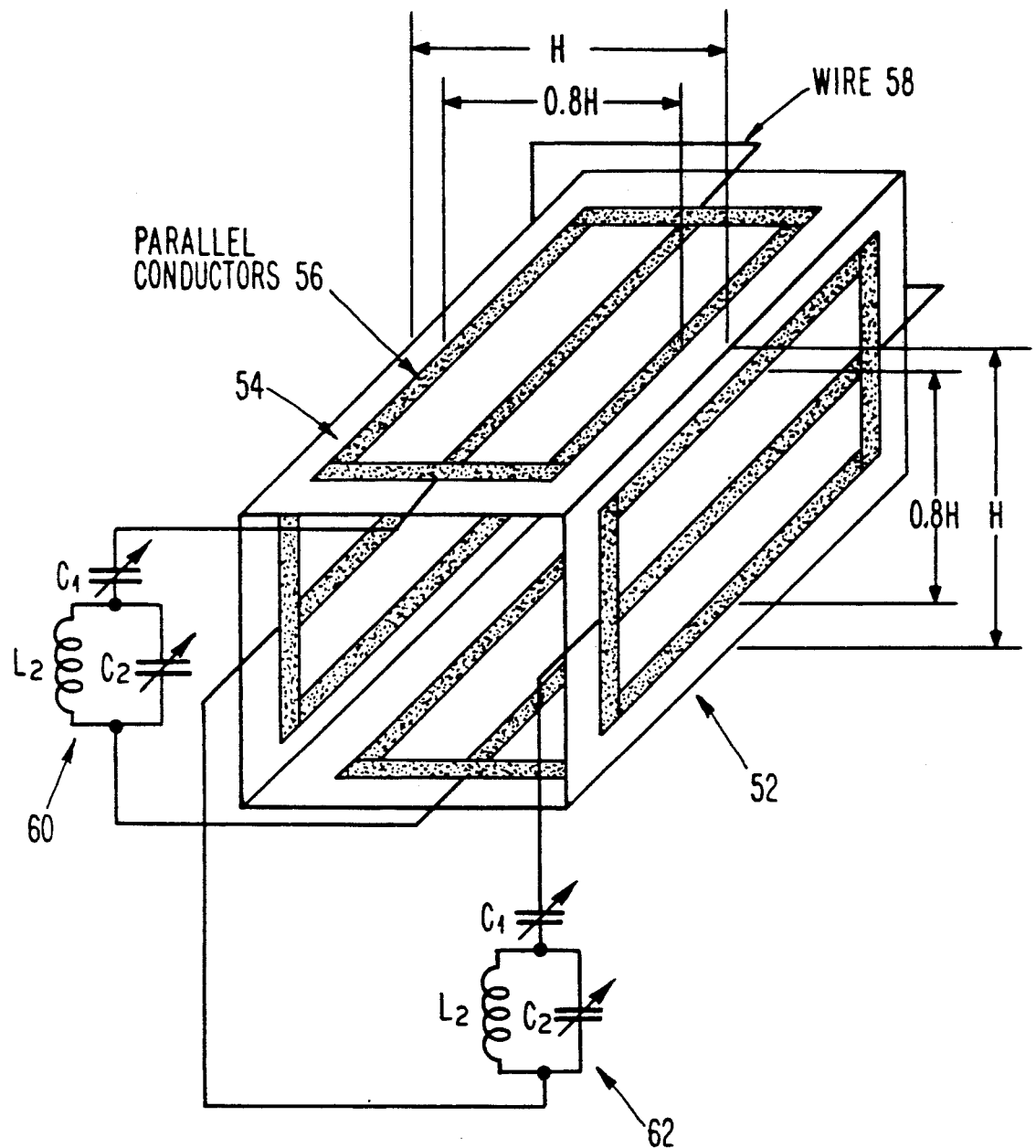
FIG. 7 illustrates an alternative embodiment in which a quadrature coil is formed by placing two orthogonal biplanar coils adjacent each other so as to enclose a volume open at both ends.

C. A quadrature coil based upon a biplanar geometry has been developed which combines the advantages of a birdcage design which may be used in a quadrature mode with the benefits of a biplanar design as described herein. As illustrated in FIG. 7, this coil comprises a second biplanar coil 52 disposed orthogonal to the first biplanar coil 54 so as to form a volume open at both ends. When a suitable coupling is provided to parallel conductors 56 (which may be three or four parallel strips of copper tape) via wire 58, circularly polarized magnetic fields are produced in a manner consistent with the standard techniques used by those skilled in the art for cylindrical coils. Tank circuits 60 and 62 and variable capacitors $C_1$ may also be provided for tuning the coil of FIG. 7 to the desired resonant frequencies. In the illustrated embodiment, the coil is square, and the distance between the outermost longitudinal conductors on each side is 0.8 times the side length H.

As will be apparent to those skilled in the art, the quadrature design of FIG. 7 does not allow for flexible separation of the planes of the coil as in the embodiment of FIG. 4. In this sense, the embodiment of FIG. 7 is similar to cylindrical designs such as the birdcage coil. However, because the coil of FIG. 7 is a square coil, it may provide greater sensitivity than a cylindrical quadrature design in certain applications where the wires of the coil may be brought closer to the sample. Moreover, the quadrature biplanar coil of FIG. 7 is easier to construct and less expensive than a corresponding birdcage design and is also much easier to tune to multiple frequencies through the use of trap circuits.

As noted above, computer simulations demonstrate that the performance of the biplanar coils of the invention optimizes at a relatively low number of current elements and thus allows a coil to be designed which yields high performance yet is relatively inexpensive. In fact, the measured performance of an optimized 8-strut biplanar coil in accordance with the invention was found to be only slightly below that of a 22-strut discrete cosine coil. The biplanar design is appropriate for imaging applications in which one desires to bring the coil as close as possible to the object in order to maximize sensitivity, while at the same time maintaining a high degree of homogeneity. Such applications may include shoulder, body, breast, knee, wrist, neck, head, cardiac imaging, and the like.

The biplanar coils of the invention are also simple to design and test. Moreover, since their performance optimizes at a relatively low number of conductors, the cost of the coil is reduced if large capacitances must be placed in the struts to minimize eddy currents. Coils designed in accordance with the invention are also relatively easy to tune to multiple frequencies by adding trap circuits, thereby allowing for simultaneous study of multiple nuclei. Unlike cylindrical coil geometries, such as birdcage coils, the biplanar design of the invention also allows for completely free access to one side of the coil, as well as to both ends. This feature may be highly desirable in certain applications, because the patient may simply slide into the coil or the coil may simply slide onto the sample. For this reason, the biplanar coils of the invention may be particularly advantageous for use in imaging many different regions of the body, such as those enumerated above.

Biplanar coils in accordance with the invention thus represent a tradeoff between sensitivity and homogeneity. Although the magnetic field maps demonstrate excellent homogeneity in the central region of the coil, the homogeneity of the biplanar coil is slightly below that of the discrete cosine or birdcage coil. However, this is compensated for by the fact that, in many situations, one may design a biplanar coil which will lie much closer to the object being imaged, thereby obtaining substantially increased sensitivity.

Although an exemplary embodiment of the invention has been described in detail above, those skilled in the art will readily appreciate that many additional modifications are possible in the exemplary embodiment without materially departing from the novel teachings and advantages of the invention. For example, the biplanar coils of the invention may be used in other fields. Namely, biplanar coils may be used to form uniform magnetic fields for use in magnetic deflection circuitry of cathode ray tubes. Such an arrangement leads to the possibility of designing relatively flat cathode ray tubes. Accordingly, all such modifications are intended to be included within the scope of this invention as defined in the following claims.

We claim:

1. A biplanar coil, comprising:
    a first planar resonating element comprising a first set of substantially parallel conductors extending in a longitudinal direction of said first planar resonating element and transverse end conductors at respective ends of said first set of conductors for electrically connecting said first set of conductors at said respective ends thereof;
    a second planar resonating element, disposed substantially parallel to said first planar resonating element, comprising a second set of substantially parallel conductors extending in a longitudinal direction of said second planar resonating element and transverse end conductors at respective ends of said second set of conductors for electrically connecting said second set of conductors at said respective ends thereof, whereby said second set of conductors are substantially parallel to said first set of conductors; and
    means for applying a current to the transverse end conductor at one end of said first planar resonating element so that said current propagates in a first direction through each conductor of said first set of conductors, and for applying said current to the transverse end conductor at one end of said second planar resonating element so that said current propagates in a second direction, substantially opposite to said first direction, through each conductor of said second set of conductors, said current through said first and second sets of conductors causing a substantially homogeneous magnetic field to be formed in a volume between said first and second planar resonating elements.

2. A biplanar radio-frequency coil for use in magnetic resonance imaging and spectroscopy, comprising:
    a first planar resonating element comprising a first set of substantially parallel conductors extending in a longitudinal direction of said first planar resonating element and transverse end conductors at respective ends of said first set of conductors for electrically connecting said first set of conductors at said respective ends thereof;
    a second planar resonating element, disposed substantially parallel to said first planar resonating element, comprising a second set of substantially parallel conductors extending in a longitudinal direction of said second planar resonating element and transverse end conductors at respective ends of said second set of conductors for electrically connecting said second set of conductors at said respective ends thereof, whereby said second set of conductors are substantially parallel to said first set of conductors;
    a flexible conductor for electrically connecting oppositely disposed transverse end conductors at one end of said first and second substantially parallel planar resonating elements; and
    means for applying a current to the transverse end conductor of said first planar resonating element which is at an end opposite said one end of said first planar resonating element, said current propagating in a first direction through each conductor of said first set of conductors, through the transverse end conductor at said one end of said first planar resonating element, and through said flexible conductor, and then said current propagating in a second direction, substantially opposite to said first direction, through each conductor of said second set of conductors, said current through said first and second sets of conductors causing a substantially homogeneous magnetic field to be formed in a volume between said first and second planar resonating elements.

3. A coil as in claim 2, wherein said first and second planar resonating elements have a width in a direction transverse to said longitudinal direction which is approximately 1.2 times the distance between said first and second planar resonating elements.

4. A coil as in claim 2, wherein each of said conductors of said first and second sets of conductors comprises a strip of copper tape.

5. A coil as in claim 4, wherein said first and second sets of conductors each comprise four substantially parallel strips of copper tape.

6. A coil as in claim 2, wherein said volume is centered between said first and second planar resonating elements, said volume having a side length which is one-half the distance between said first and second planar resonating elements.

7. A coil as in claim 2, further comprising means for double tuning said biplanar coil to at least two resonant frequencies.

8. A coil as in claim 7, wherein said resonant frequencies comprise the resonant frequencies for $^1H$ and $^{31}P$.

9. A coil as in claim 2, further comprising means for adjusting the separation distance between said first and second planar resonating elements.

10. A radio-frequency coil for use in magnetic resonance imaging and spectroscopy, comprising:

first and second biplanar radio-frequency coils disposed substantially perpendicularly to each other so as to form a volume having open ends, each of said biplanar radio-frequency coils comprising a first planar resonating element having a first set of substantially parallel conductors extending in a longitudinal direction of said first planar resonating element and transverse end conductors at respective ends of said first set of conductors for electrically connecting said first set of conductors at said respective ends thereof, and a second planar resonating element, disposed substantially parallel to said first planar resonating element, and having a second set of substantially parallel conductors extending in a longitudinal direction of said second planar resonating element and transverse end conductors at respective ends of said second set of conductors for electrically connecting said second set of conductors at said respective ends thereof, whereby said second set of conductors are substantially parallel to said first set of conductors; and means for applying a current to the transverse end conductor at one end of each of said first planar resonating elements so that said current propagates in a first direction through each conductor of said first set of conductors, and for applying said current to the transverse end conductor at one end of each of said second planar resonating elements so that said current propagates in a second direction, substantially opposite to said first direction, through each conductor of said second set of conductors, said current through each of said first and second sets of conductors causing a substantially circularly polarized magnetic field to be formed in said volume.

11. A coil as in claim 10, further comprising means for double tuning said first and second biplanar radio-frequency coils to at least two resonant frequencies.

12. A coil as in claim 11, wherein said resonant frequencies comprise the resonant frequencies for $^1H$ and $^{31}P$.

* * * * *